US011152597B2

(12) United States Patent
Ohara

(10) Patent No.: US 11,152,597 B2
(45) Date of Patent: Oct. 19, 2021

(54) DISPLAY DEVICE

(71) Applicant: Japan Display Inc., Tokyo (JP)

(72) Inventor: Hiroki Ohara, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/734,532

(22) Filed: Jan. 6, 2020

(65) Prior Publication Data

US 2020/0227682 A1 Jul. 16, 2020

(30) Foreign Application Priority Data

Jan. 11, 2019 (JP) .............................. JP2019-003067

(51) Int. Cl.
*H01L 33/00* (2010.01)
*H01L 51/52* (2006.01)
*H01L 51/50* (2006.01)

(52) U.S. Cl.
CPC ...... *H01L 51/5256* (2013.01); *H01L 51/5012* (2013.01); *H01L 51/5206* (2013.01); *H01L 51/5221* (2013.01)

(58) Field of Classification Search
CPC ............. H01L 51/5256; H01L 51/5012; H01L 51/5206; H01L 51/5221; H01L 27/3246
See application file for complete search history.

(56) References Cited

U.S. PATENT DOCUMENTS

| 2011/0236674 | A1* | 9/2011 | Aiba | C08J 7/0423 |
| | | | | 428/335 |
| 2013/0168644 | A1* | 7/2013 | Park | H01L 51/5234 |
| | | | | 257/40 |
| 2013/0313547 | A1 | 11/2013 | Nakano et al. | |
| 2014/0061625 | A1* | 3/2014 | Zhang | H01L 51/5088 |
| | | | | 257/40 |
| 2014/0145979 | A1* | 5/2014 | Lee | H01L 51/5281 |
| | | | | 345/173 |
| 2017/0237025 | A1* | 8/2017 | Choi | H01L 51/56 |
| | | | | 257/40 |
| 2017/0263892 | A1* | 9/2017 | Senoo | H01L 51/0097 |
| 2017/0346041 | A1* | 11/2017 | Kim | H01L 51/5256 |
| 2019/0198587 | A1* | 6/2019 | Park | H01L 27/3258 |
| 2020/0083484 | A1* | 3/2020 | Lee | H01L 51/5256 |

FOREIGN PATENT DOCUMENTS

JP 2013-243094 A 12/2013

* cited by examiner

*Primary Examiner* — Phuc T Dang
(74) *Attorney, Agent, or Firm* — Michael Best & Friedrich LLP

(57) ABSTRACT

A display device includes a first substrate, a display region with pixels each including a light emitting element above the first substrate, a first inorganic insulating layer covering the display region, a first organic insulating layer on the first inorganic insulating layer, a second inorganic insulating layer on the first organic insulating layer, a second organic insulating layer on the second inorganic insulating layer, a third organic insulating layer a on the second organic insulating layer, acidity of the third organic insulating layer being stronger than acidity of the second organic insulating layer, and a polarizing plate arranged on the third organic insulating layer.

8 Claims, 15 Drawing Sheets

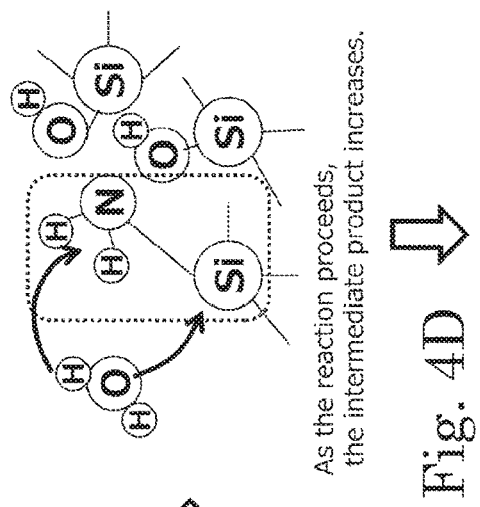
Fig. 4A
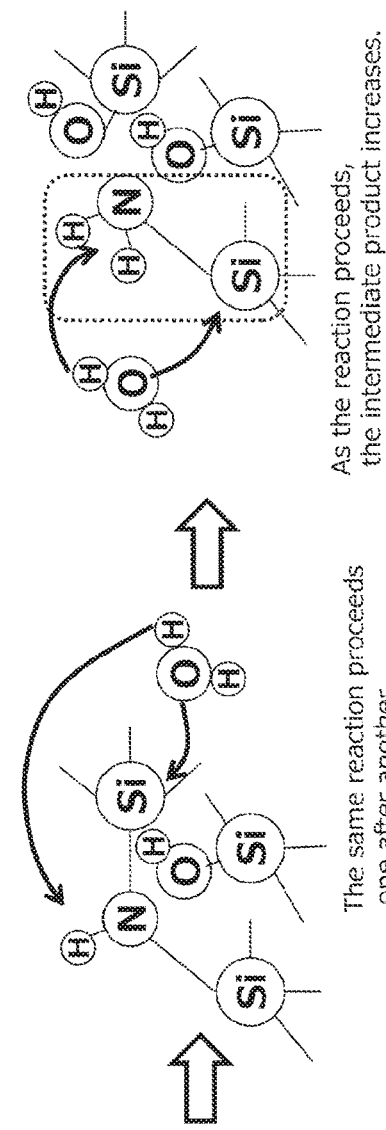
Fig. 4B
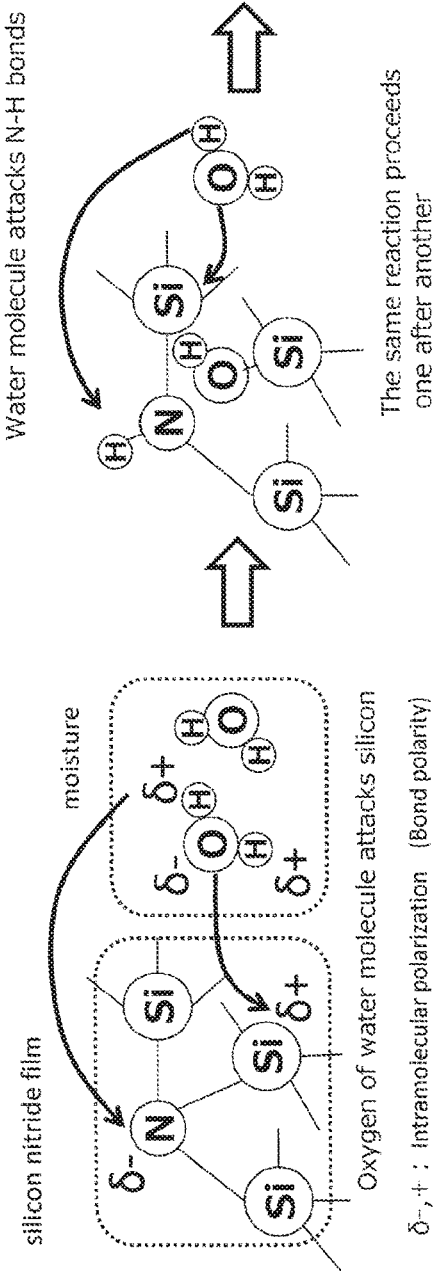
Fig. 4C
Fig. 4D
Fig. 4E
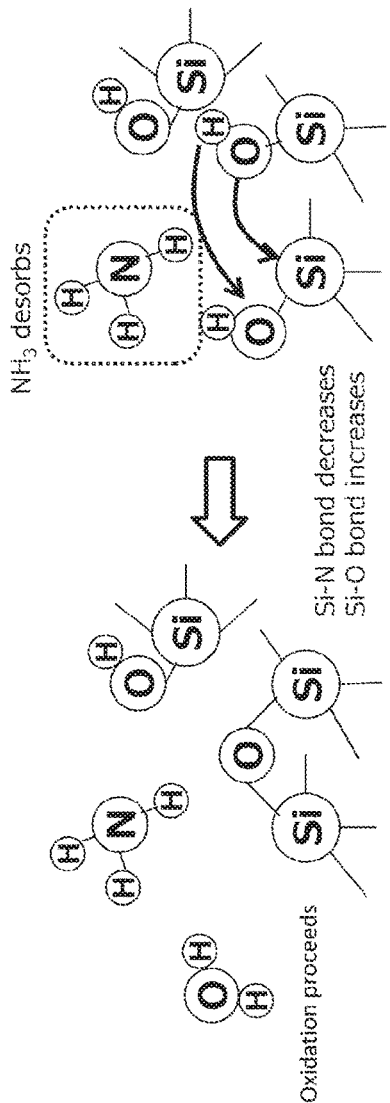

DISPLAY DEVICE

CROSS REFERENCE TO RELATED APPLICATIONS

This application is based upon and claims the benefit of priority from the prior Japanese Patent Application No. 2019-003067, filed on Jan. 11, 2019, the entire contents of which are incorporated herein by reference.

FIELD

One embodiment of the present invention is related to a display region in a display device.

BACKGROUND

Conventionally, an organic EL display device (Organic Electroluminescence Display) using an organic electroluminescence material (organic EL material) in a light emitting element (organic EL element) of a display region has been known as a display device. An organic EL display device is a so-called self-light emitting type display device which realizes a display by causing an organic EL material to emit light.

A light emitting element included in a display region deteriorates due to moisture. The deterioration of a light emitting element is suppressed by arranging a sealing film above the light emitting element in order to prevent the entrance of moisture to the light emitting element. For example, a display device is disclosed in patent document 1 (Japanese Laid Open Patent Publication No: 2013-243094) in which a first sealing film and a second sealing film comprised form an inorganic material such as a silicon nitride film or silicon oxide film are arranged above a light emitting element.

SUMMARY

A display device in an embodiment according to the present invention includes a first substrate, a display region with pixels each including a light emitting element above the first substrate, a first inorganic insulating layer covering the display region, a first organic insulating layer on the first inorganic insulating layer, second inorganic insulating layer on the first organic insulating layer, a second organic insulating layer on the second inorganic insulating layer, a third organic insulating layer on the second organic insulating layer, acidity of the third organic insulating layer being stronger than acidity of the second organic insulating layer, and a polarizing plate arranged on the third organic insulating layer.

A display device in an embodiment according to the present invention includes a first substrate, a display region with pixels each including a light emitting element above the first substrate, a first inorganic insulating layer covering the display region, a first organic insulating layer on the first inorganic insulating layer, a second inorganic insulating layer on the first organic insulating layer, a first electrode on the second inorganic insulating layer, a third inorganic insulating layer on the first electrode, a second electrode on the third inorganic insulating layer and electrically connected to the first electrode, a second organic insulating layer on the second electrode, a third organic insulating layer on the second organic insulating layer, acidity of the third organic insulating layer being stronger than acidity of the second organic insulating layer, and a polarizing plate arranged on the third organic insulating layer.

A manufacturing method of a display device in an embodiment according to the present invention includes forming pixels each including a light emitting element above a first substrate, forming a first inorganic insulating layer covering the pixels, forming a first organic insulating layer on the first inorganic insulating layer, forming a second inorganic insulating layer on the first organic insulating layer, forming a second organic insulating layer on the second inorganic insulating layer, forming a third organic insulating layer on the second organic insulating layer, acidity of the third organic insulating layer being stronger than acidity of the second organic insulating layer, and bonding a polarizing plate on the third organic insulating layer.

BRIEF DESCRIPTION OF DRAWINGS

FIG. 4A is a diagram for explaining a mechanism for desorbing $NH_3$ from a film including nitrogen;

FIG. 4B is a diagram for explaining a mechanism for desorbing $NH_3$ from a film including nitrogen;

FIG. 4C is a diagram for explaining a mechanism for desorbing $NH_3$ from a film including nitrogen;

FIG. 4D is a diagram for explaining a mechanism for desorbing $NH_3$ from a film including nitrogen;

FIG. 4E is a diagram for explaining a mechanism for desorbing $NH_3$ from a film including nitrogen;

DESCRIPTION OF EMBODIMENTS

Figure 1:
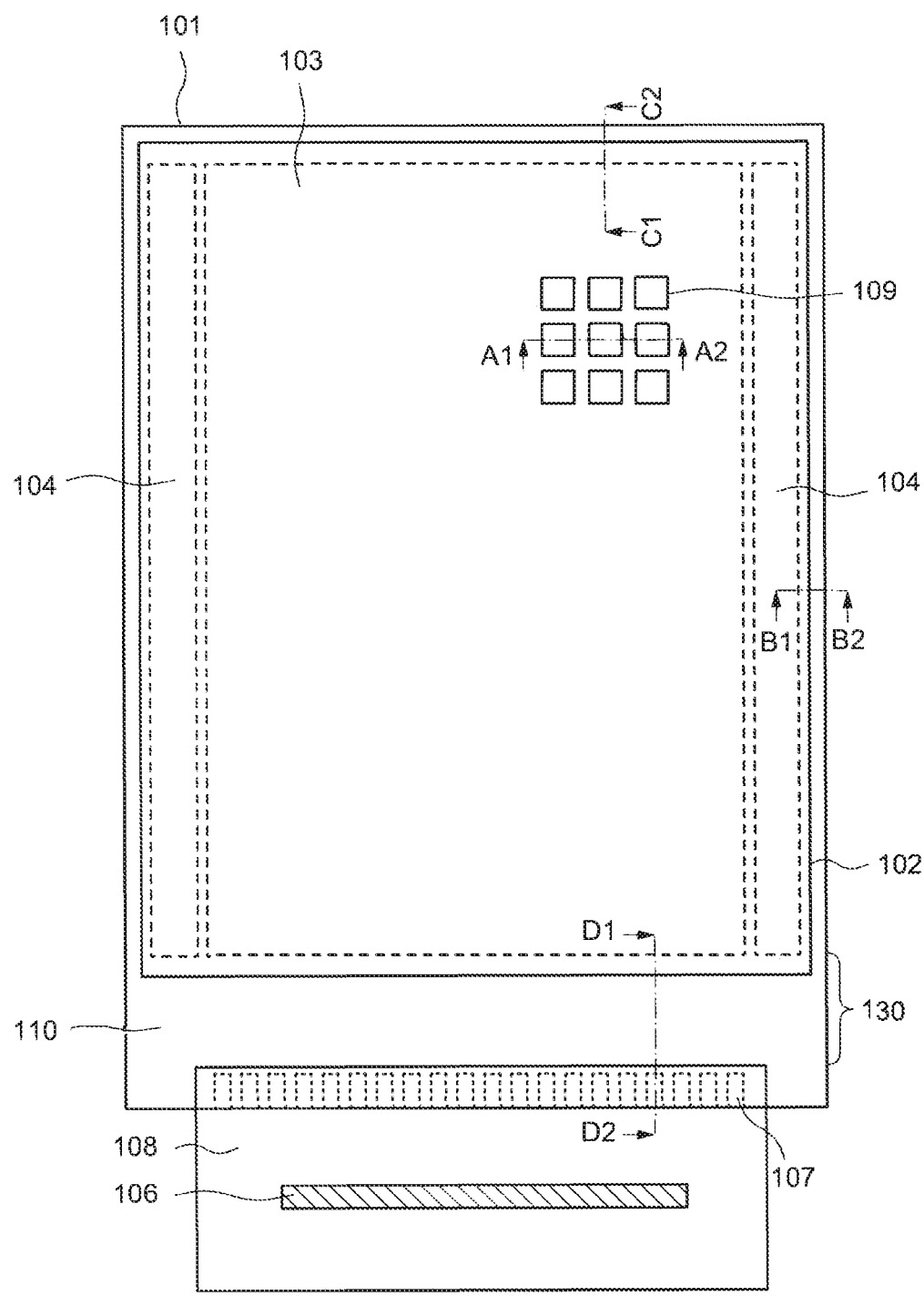
FIG. 1 is a schematic view showing a structure of a display device related to one embodiment of the present invention.

Each embodiment of the present invention is explained below while referring to the drawings. However, the present invention can be implemented in various modes without departing from the gist of the invention and should not to be interpreted as being limited to the description of the embodiments exemplified below.

Although the drawings may be schematically represented in terms of width, thickness, shape, and the like of each part as compared with their actual mode in order to make explanation clearer, it is only an example and an interpretation of the present invention is not limited. In addition, in the drawings, the same reference numerals are provided to the same elements as those described above with reference to preceding figures and repeated explanations may be omitted accordingly.

In the case when a single film is processed to form a plurality of structural bodies, each structural body may have different functions and roles, and the bases formed beneath each structural body may also be different. However, the plurality of structural bodies are derived from films formed in the same layer by the same process and have the same material. Therefore, the plurality of these films are defined as existing in the same layer.

When expressing a mode in which another structure is arranged above a certain structure, in the case where it is simply described as [above], unless otherwise noted, a case where another structure is arranged directly above a certain structure as if in contact with that structure, and a case where another structure is arranged via another structure above a certain structure, are both included.

The expression [a certain structure is exposed from another structure] means a region where a part of a certain structure is not covered by another structure. However, the part which is not covered by another structure also includes the case where it is covered by yet another structure.

First Embodiment

An example of the structure of a display device 100 related to one embodiment of the present invention is explained while referring to FIG. 1 to FIG. 9.

<Display Device Structure>

FIG. 1 is a planar view of a display device 100 related to one embodiment of the present invention. A substrate 101 includes a display region 103, a periphery region 110 which surrounds the display region 103, a scanning line drive circuit 104 arranged in the periphery region 110, a plurality of terminals 107 arranged at an end part of the substrate 101, and a bent region 130 arranged between the display region 103 and the plurality of terminals 107. In addition, a polarizing plate 102 is arranged overlapping the display region 103 and the scanning line drive circuit 104.

The display region 103 includes a plurality of pixels 109 and the plurality of pixels 109 are arranged in a matrix.

The periphery region 110 is a region from the display region 103 to the end part of the substrate 101. In other words, the periphery region 110 is a region where the display region 103 is arranged above the substrate 101 (that is, a region outside of the display region). The scanning line drive circuit 104 and the plurality of terminals 107 are arranged provided in the periphery region 110. The scanning line drive circuits 104 are arranged to oppose the display region 103. The plurality of terminals 107 are connected to a flexible printed circuit substrate 108. A driver IC 106 is arranged above the flexible printed circuit substrate 108.

The bent region 130 is a region where the substrate 101 is bent. In the bent region 130, the frame of the display device 100 can be narrowed by bending the substrate 101 so that the plurality of terminals 107 of the substrate 101 overlap with the rear surface of the display region 103.

An image signal and various control signals are supplied from a controller (not shown in the diagram) external to the display device 100 via the flexible printed circuit substrate 108. The image signal is processed by the driver IC 106 and input to the plurality of pixels 109. Each circuit signal is input to the scanning line drive circuit 104 via the driver IC 106.

In addition to the image signal and each drive circuit, power for driving the scanning line drive circuit 104, the driver IC 106 and the plurality of pixels 109 is supplied to the display device 100. Each of the plurality of pixels 109 includes a light emitting element 240 which is described later. A part of the power which is supplied to the display device 100 is supplied to the light emitting element 240 included in each of the plurality of pixels 109 and causes the light emitting element 240 to emit light.

<Pixel Circuit>

Figure 2:
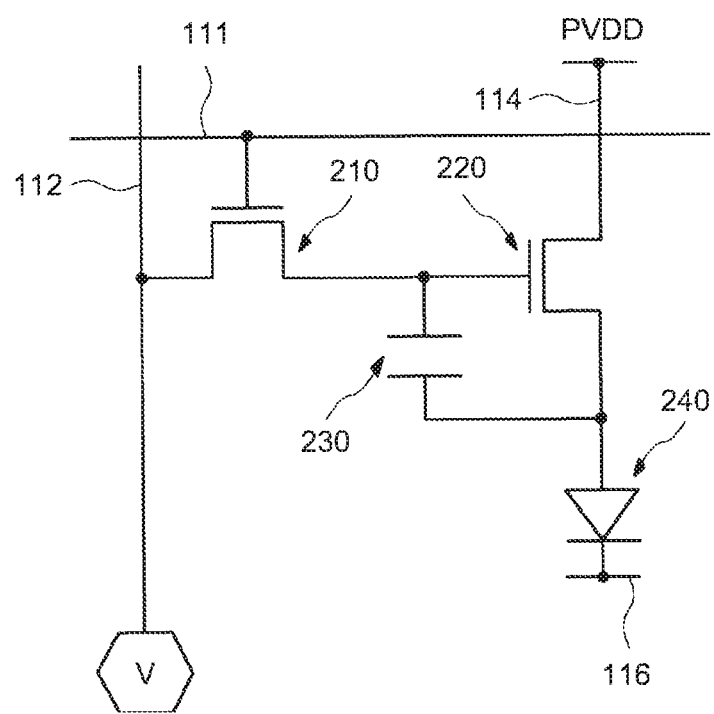
FIG. 2 is a circuit diagram of a pixel in a display device related to one embodiment of the present invention.

FIG. 2 is a pixel circuit included in each of the plurality of pixels 109 arranged in the display device 100 related to the present invention. The pixel circuit includes at least a transistor 210, a transistor 220, a capacitor 230 and a light emitting element 240.

The transistor 210 functions as a selection transistor. That is, in the transistor 210, the conduction state of the gate of the transistor 210 is controlled by a scanning line 111. The gate of the transistor 210 is connected to the scanning line 111, a source is connected to the signal line 112, and a drain is connected to a gate of the transistor 220.

The transistor 220 functions as a drive transistor. That is, the transistor is connected to the light emitting element 240 and controls the light emitting luminosity of the light emitting element 240. A gate of the transistor 220 is connected to a source of the transistor 210, the source is connected to a drive power supply line 114, and a drain connected to an anode of the light emitting element 240.

One capacitor electrode of the capacitor 230 is connected to the gate of the transistor 220 and connected to the drain of the transistor 210. In addition, the other capacitor electrode is connected to the anode of the light emitting element 240 and the drain of the transistor 220.

The anode of the light emitting element 240 is connected to the drain of the transistor 220 and a cathode is connected to the reference power line 116.

<Display Region Structure>

Figure 3:
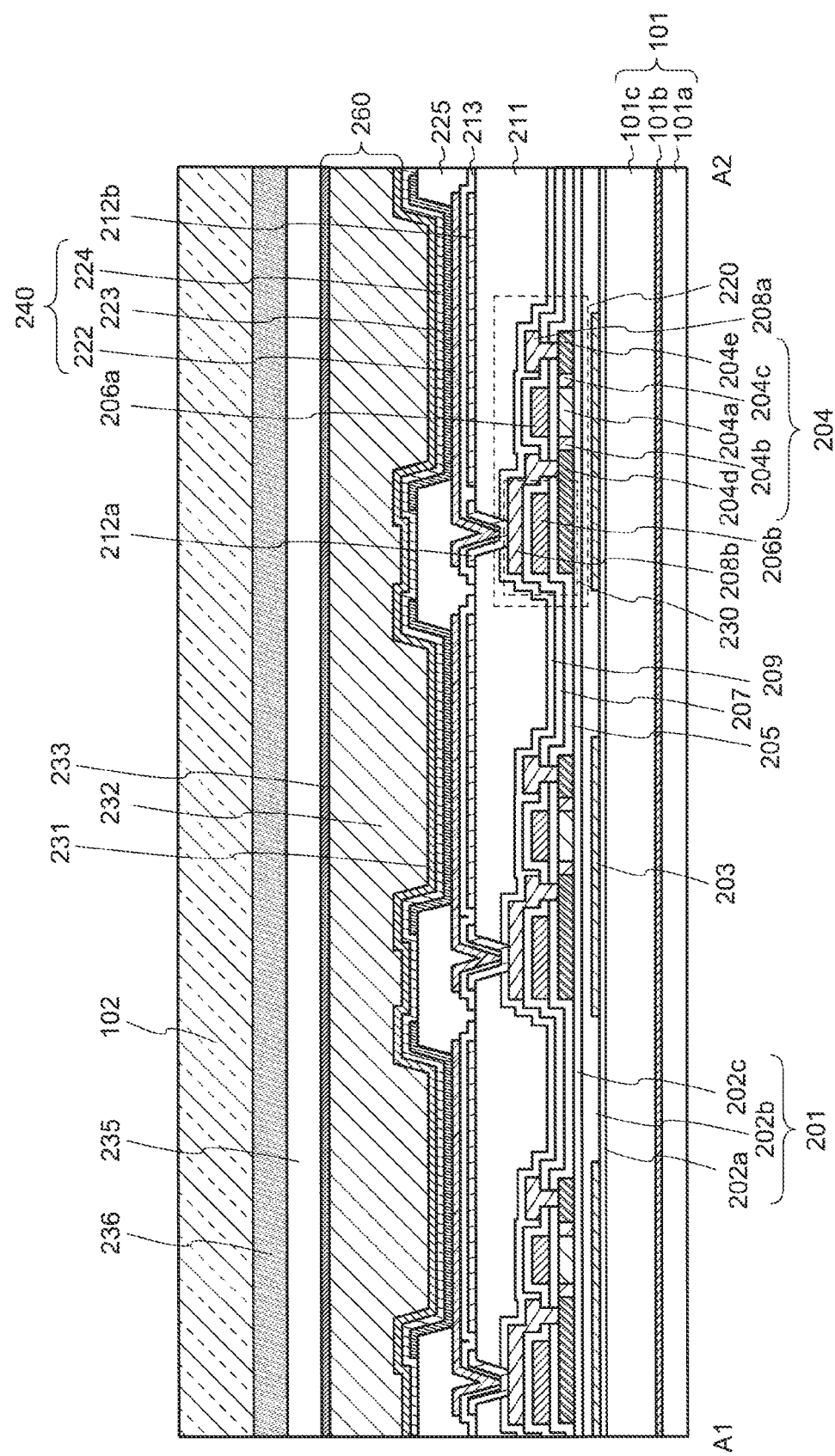
FIG. 3 is a cross-sectional view of a pixel in a display device related to one embodiment of the present invention.

FIG. 3 is a cross-sectional view in the case where the display device 100 shown in FIG. 1 is cut along the line A1-A2. FIG. 3 is a cross-sectional view of the pixel 109 of the display device 100 related to one embodiment of the present invention.

The substrate 101 has a stacked layer structure including a first resin layer 101*a*, an inorganic layer 101*b* and a second resin layer 101*c*. The first resin layer 101*a* and the second resin layer 101*c* are formed as layers including a material selected from, for example, acrylic, polyimide, polyethylene terephthalate, and polyethylene naphthalate and the like. In addition, silicon nitride, silicon oxide or amorphous silicon is used as the inorganic layer 101*b*. It is preferred that the inorganic layer 101*b* is arranged between the first resin layer 101*a* and the second resin layer 101*c* in order to improve adhesion between the first resin layer 101*a* and the second resin layer 101*c*.

An undercoat layer 202 is arranged on the substrate 101. The undercoat layer 202 is arranged by, for example, a single layer or a stacked layer of a silicon oxide film and a silicon nitride film. In the present embodiment, the undercoat layer 202 is arranged by stacking three layers of a silicon oxide layer 202a, a silicon nitride layer 202b and a silicon oxide layer 202c. Since the silicon oxide layer 202a is used to improve adhesion to the substrate, the silicon nitride layer 202b is used as a blocking film for moisture and impurities from the exterior, the silicon oxide layer 202c functions as a blocking film to ensure that hydrogen included in the silicon nitride layer 202b described later is prevented from diffusing to the semiconductor layer side.

In addition, the undercoat layer 202 may be arranged with a light shielding layer 203 to match the location where the transistor 220 is arranged. Since the light shielding layer 203 suppresses changes in transistor characteristics due to entrance of light from the back surface of a channel of the transistor 220, or forms the light shielding layer 203 as a conductive layer, it is possible to impart the transistor 220 with back-gate effects by providing a predetermined potential to the transistor 220. That is, the undercoat layer 202 is arranged with the silicon oxide layer 202a, the light shielding layer 203, the silicon nitride layer 202b and the silicon oxide layer 202c.

The transistor 220 is arranged above the undercoat layer 202. The transistor 220 includes a semiconductor layer 204, a gate insulating film 205 and a gate electrode 206a. Although an example is shown in which an n-channel transistor is used as the transistor 220, a p-channel transistor may also be used. In the present embodiment, a n-channel TFT has a structure in which low concentration impurity regions 204b and 204c are arranged between a channel region 204a and source or drain regions 204d and 204e (high concentration impurity regions). Amorphous silicon, poly-silicon, or an oxide semiconductor is used as the semiconductor layer 204. For example, silicon oxide or silicon nitride is arranged as a single layer or a stacked layer as the gate insulating film 205. For example, MoW is used as the gate electrode 206a. Furthermore, although the structure of the transistor 220 is shown in FIG. 3, the structure of the transistor 210 is similar to the structure of the transistor 220.

An interlayer insulating layer 207 is arranged to cover the gate electrode 206a. The interlayer insulating layer 207 is arranged with a single layer or a stacked layer of a silicon oxide layer or a silicon nitride layer. Source or drain electrodes 208a and 208b are arranged above the interlayer insulating layer 207.

Each of the source or drain electrodes 208a and 208b is connected to the source or drain regions 204d and 204e of the semiconductor layer 204 via opening parts in the interlayer insulating layer 207 and the gate insulating film 205.

Here, a conductive layer 206b is arranged above the gate insulating film 205. The conductive layer 206b is formed in the same process as the gate electrode 206a. The conductive layer 206b forms a capacitor by the source or drain regions 204d and 204e of the semiconductor layer 204 interposed by the gate insulating film 205. In addition, the conductive layer 206b forms a capacitor by the source or drain electrode 208b interposed by the interlayer insulating layer 207.

A planarization film 211 is arranged above the source or drain electrodes 208a and 208b.

An insulating layer 213 is arranged above the planarization film 211. An organic material such as photosensitive acrylic or polyimide is used as the planarization film 211. By arranging the planarization film 211, it is possible to planarize a step caused by the transistor 220.

Transparent conductive films 212a and 212b are arranged above the planarizing film 211. The transparent conductive film 212a is connected to the source or drain electrode 208b through the opening part of the planarization film 211 and the insulating layer 209.

An insulating layer 213 is arranged above the transparent conductive films 212a and 212b. The insulating layer 213 is arranged with openings parts in a region which overlaps the transparent conductive film 212a and the source or drain electrode 208b, and a region between the transparent conductive film 212a and the transparent conductive film 212b of an adjacent pixel.

A pixel electrode 222 is arranged above the insulating layer 213. The pixel electrode 222 is connected to the transparent conductive film 212a through the opening part of the insulating layer 213. The pixel electrode 222 is formed as a reflective electrode and has a three layer structure of IZO, Ag, and IZO.

An insulating layer 225 which becomes a partition wall is arranged at the boundary between a pixel electrode 222 and the pixel electrode 222 of the adjacent pixel. The insulating layer 225 is also called a bank or a rib. An organic material similar to the material of the planarization film 211 is used for the insulating layer 225. The insulating layer 225 is opened so that a part of the pixel electrode 222 is exposed. In addition, it is preferred that the end part of an opening part takes on a gentle taper shape. When the end part of the opening has a steep shape, coverage failure occurs in the organic layer 223 which is formed later.

Here, the planarization film 211 and the insulating layer 225 contact with each other at an opening part arranged in the insulating layer 225. By including such a structure, it is possible to remove moisture and gas which are released from the planarization film 211 when carrying out heat treatment when the insulating layer 225 is formed. In this way, it is possible to suppress peeling at the interface between the planarization film 211 and the insulating layer 225.

After forming the insulating layer 225, an organic layer 223 for forming an organic EL layer is stacked. Although the organic layer 223 is shown as a single layer in FIG. 3, a hole transport layer, a light emitting layer and an electron transport layer are stacked in that order from the pixel electrode 222 side. In addition, although the light emitting layer in the organic layer 223 is described as being selectively arranged for each pixel 109 in FIG. 3, a hole transport layer and an electron transport layer may also be arranged in all over the display region 103. These layers may be formed by vapor deposition, or may be formed by coating on a solvent dispersion. Not only the hole transport layer and the electron transport layer, but a light emitting layer may also be arranged in all over the display region 103. In the case where the light emitting layer is arranged in all over the display region 103, white light can be obtained in all the pixels and it is possible to adopt a structure in which a desired color wavelength part can be extracted by a color filter (not shown in the diagram).

After formation of the organic layer 223, the counter electrode 224 is formed. Here, since a top emission structure is adopted, the counter electrode 224 is required have light translucency. Furthermore, a top emission structure means a structure in which light is emitted from the counter electrode 224 which is arranged above the pixel electrode 222 interposed by the organic layer 223. Here, an MgAg film is formed as a thin film which allows light emitted from the organic EL layer to pass therethrough as the counter electrode 224. According to the order of formation of the organic layer 223 described above, the pixel electrode 222 side becomes an anode, and the counter electrode 224 side becomes a cathode.

A sealing film 260 is arrange above the counter electrode 224 of the light emitting element 240. The sealing film 260 has a function for preventing moisture from entering the organic layer 223 from the exterior, and the sealing film 260 is required to have high gas barrier properties. A film containing nitrogen can be given as an example of a film having such a function. Here, a structure is shown in which a first inorganic insulating layer 231, an organic insulating layer 232 and a second inorganic insulating layer 233 are stacked as the sealing film 260 including a film containing nitrogen.

A resin mask 235 (also called a second organic insulating layer) is arranged to cover the display region 103. The resin mask 235 has a mask function for etching the first inorganic insulating layer 231 and the second inorganic insulating layer 233. For example, an acrylic resin, rubber resin, silicone resin or urethane resin adhesive can be used as the resin mask 235.

A polarizing plate 102 is arranged above the resin mask 235. The polarizing plate 102 has a laminated structure including a quarter wavelength plate and a linear polarizing plate. By adopting this structure, it is possible to emit light from the light emitting region to the exterior from the display side surface of the polarizing plate 102. Here, the thickness of the polarizing plate 102 is 100 μm to 200 μm.

As explained above, by arranging the sealing film 260 above the light emitting element 240, it is possible to suppress moisture the entrance of moisture from the exterior from entering the light emitting element 240. However, there is a problem whereby moisture entering from the outside or moisture included in an organic resin reacts with a film including nitrogen which may generate ammonium ions.
<Mechanism of Ammonia Ion Generation>

Next, in the case when a silicon nitride film is used as a film including nitrogen, moisture which enters from the exterior or moisture included the organic resin reacts with the silicon nitride film which generates ammonium ions. This mechanism is explained using FIG. 4A to FIG. 4E.

As shown in FIG. 4A, moisture which is included in the resin mask 235 and oxygen of the moisture which enters from the exterior attack the silicon of the silicon nitride film. Next, as shown in FIG. 4B, moisture attacks not only the silicon of the silicon nitride film but also the N—H bond. As the reaction proceeds, the intermediate product ≡Si—N—H2 increases as shown in FIG. 4C. As the reaction proceeds further, $NH_3$ is desorbed from the silicon nitride film as shown in FIG. 4D. Finally, Si—N bonds decrease and Si—O bonds increase. That is, as shown in FIG. 4E, the silicon nitride film becomes oxidized by moisture.

As was explained above, a film including nitrogen contained in the sealing film which is arranged above the light emitting element generates ammonia due to hydrolysis. If moisture is not sufficiently removed from within the light emitting element, ammonia is generated from the film including nitrogen due to the movement of moisture to the sealing film. In this way, when alkaline ammonium ions are generated due to moisture, the ammonium ions reach the polarizing plate and attack the iodine complex of the polarizing plate. In this way, there is a problem whereby color loss occurs in the polarizing plate and a defect occurs in the display screen.

When $NH_3$ which is desorbed from a silicon nitride film reaches a polarizing plate through a resin mask, the iodine complex of the polarizing plate 102 is attacked. In this way, there is a problem whereby the polarizing plate is changed to white and a defect occurs on the display screen.

One object of the present invention is to suppress any change in color of a polarizing plate due to the generation of ammonia in contact between a film including nitrogen and an organic resin.

In the display device 100 related to one embodiment of the present invention, an organic prevention film 236 (also called a third organic insulating layer) is arranged between the resin mask 235 and the polarizing plate 102. The organic prevention film 236 is arranged to cover at least the display region 103. In this way, it is possible to suppress the ammonia which is generated by contact between the second inorganic insulating layer 233 and the resin mask 235 from reaching the polarizing plate 102 by the organic prevention film 236.

The organic prevention film 236 has a function for neutralizing or adsorbing ammonia. For example, in the case when the organic prevention film 236 neutralizes ammonia, it is preferred that the organic prevention film 236 show stronger acidity than the resin mask 235 (large amount of acidic components HX). Furthermore, showing a strong acidity means that the pH becomes small when it becomes a liquid.

For example, a photo-curing resin such as an epoxy resin or an acrylic resin is used as the organic prevention film 236. For example, in the case when a photo-curable resin is formed by UV curing, an additive is necessary for adjusting a monomer, a polymerization initiator, viscosity or surface tension and the like. The polymerization initiator has a cationic system and a radical system. In addition, in the case when an epoxy resin is used as the organic prevention film 236, a cationic polymerization initiator is used, and in the case when an acrylic resin is used, a radical polymerization initiator is used. In the case when a photoacid generator is used as a polymerization initiator, polymerization begins by light irradiation, and an acid is generated. An onium salt composed of a cation moiety which absorbs light and an anion moiety which serves as an acid generation source is used as the polymerization initiator. A sulfonium ion or an iodonium ion is used for the cation portion of such an onium salt. Therefore, by controlling the amount of the polymerization initiator for forming the resin mask 235 and controlling the amount of the polymerization initiator for forming the organic prevention film 236, it is possible to the make the pH of the organic prevention film 236 more acidic than the pH of the resin mask 235.

The thickness of the organic prevention film 236 is preferred to be larger than the thickness of the resin mask 235. For example, it is preferred that the total thickness of the organic prevention film 236 and the resin mask 235 is 10 μm or more and 20 μm or less. It is preferred that the thickness of the organic prevention film 236 is 1 μm or more and 15 μm or less, and the resin mask 235 is preferred to be 5 μm or more and 19 μm or less.

Figure 5:
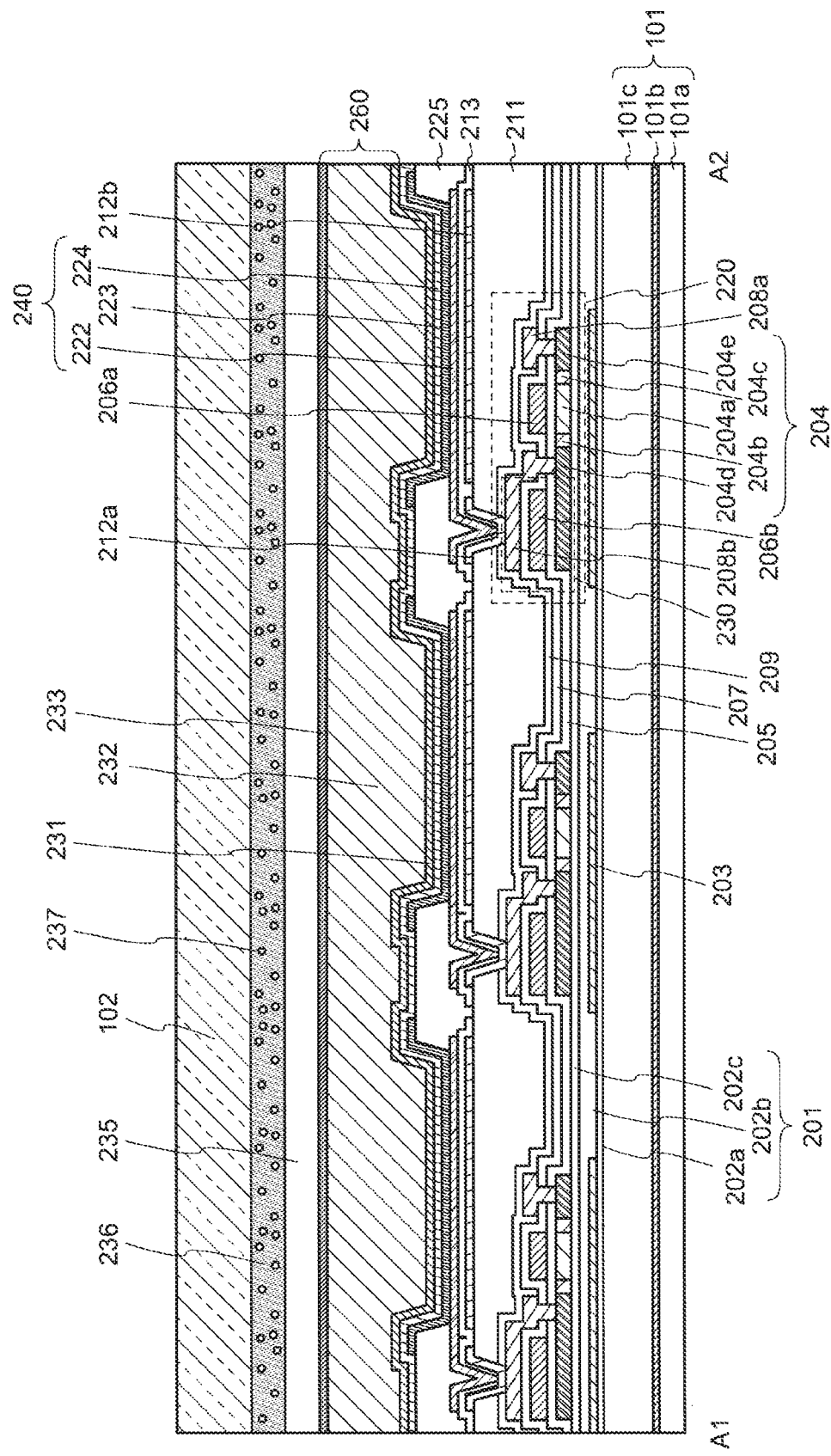
FIG. 5 is a cross-sectional view of a pixel in a display device related to one embodiment of the present invention.

FIG. 5 is a cross-sectional view of a pixel 109 of the display device 100 related to one embodiment of the present invention. Furthermore, FIG. 5 is partially different in the structure of the organic prevention film 236 shown in FIG. 3. The organic prevention film 236 shown in FIG. 5 may have a function for adsorbing ammonia. For example, an organic resin containing particles 237 such as silicon oxide, alumina, calcium oxide and aluminum silicate is used as the organic prevention film 236. The particles in the organic resin may be porous transparent fine particles. By including porous transparent fine particles in the organic resin, it is possible to adsorb ammonium ions without affecting light extraction efficiency. The particle diameter of the transparent fine particles is preferred to be, for example, 1 μm or more and 100 μm or less. In addition, the addition amount of a transparent fine particle can suppress the occurrence of scattered light when it is 10% or more and 30% or less per unit volume.

Generally, since an organic resin contains moisture, ammonia ions are generated in a structure arranged with the organic resin above a film which includes nitrogen. Therefore, even if the organic prevention film 236 is arranged in contact with the film which includes nitrogen, the generation of ammonia ions cannot be avoided. According to the display device related to one embodiment of the present invention, a stacked layer structure is adopted in which a resin mask 235 and an organic prevention film 236 having a function for neutralizing or adsorbing ammonia are arranged above a film containing nitrogen. In this way, even if ammonia is generated by contact between the film containing nitrogen and the resin mask 235, it is possible to suppress the movement of ammonia ions by the organic prevention film 236. Therefore, since ammonia ions can be prevented from reaching the polarizing plate 102, the polarizing plate 102 can be prevented from turning white.

A cover glass may be arranged above the polarizing plate 102 in the display device 100 according to necessity. A touch sensor or the like may also be formed on the cover glass. In this case, a filler using a resin or the like may be used in order to fill a gap between the polarizing plate 102 and the cover glass.

<Method for Manufacturing Display Device>

Figure 6A:
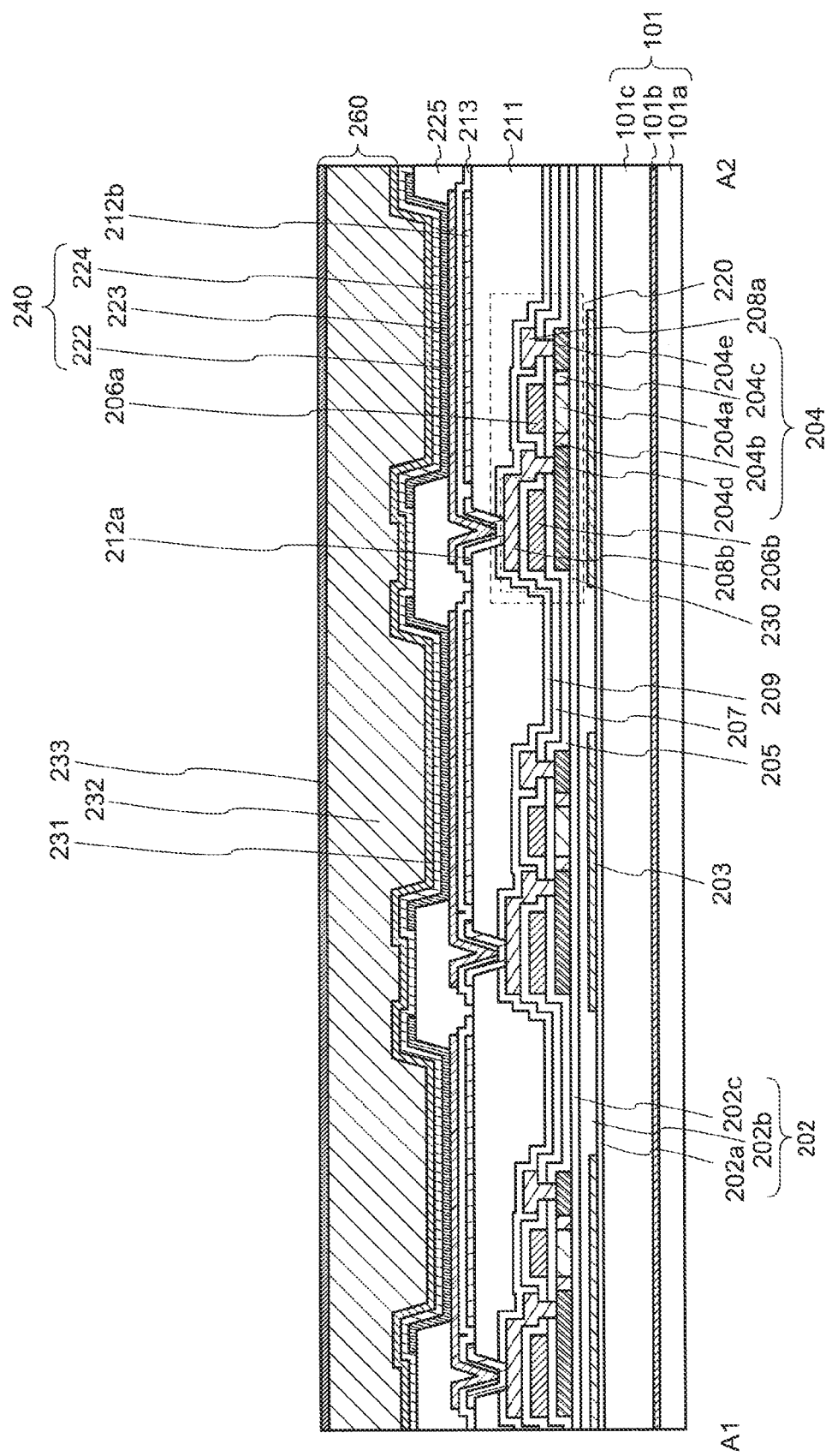
FIG. 6A is a cross-sectional view for explaining a manufacturing method of a display device related to one embodiment of the present invention.
Figure 6B:
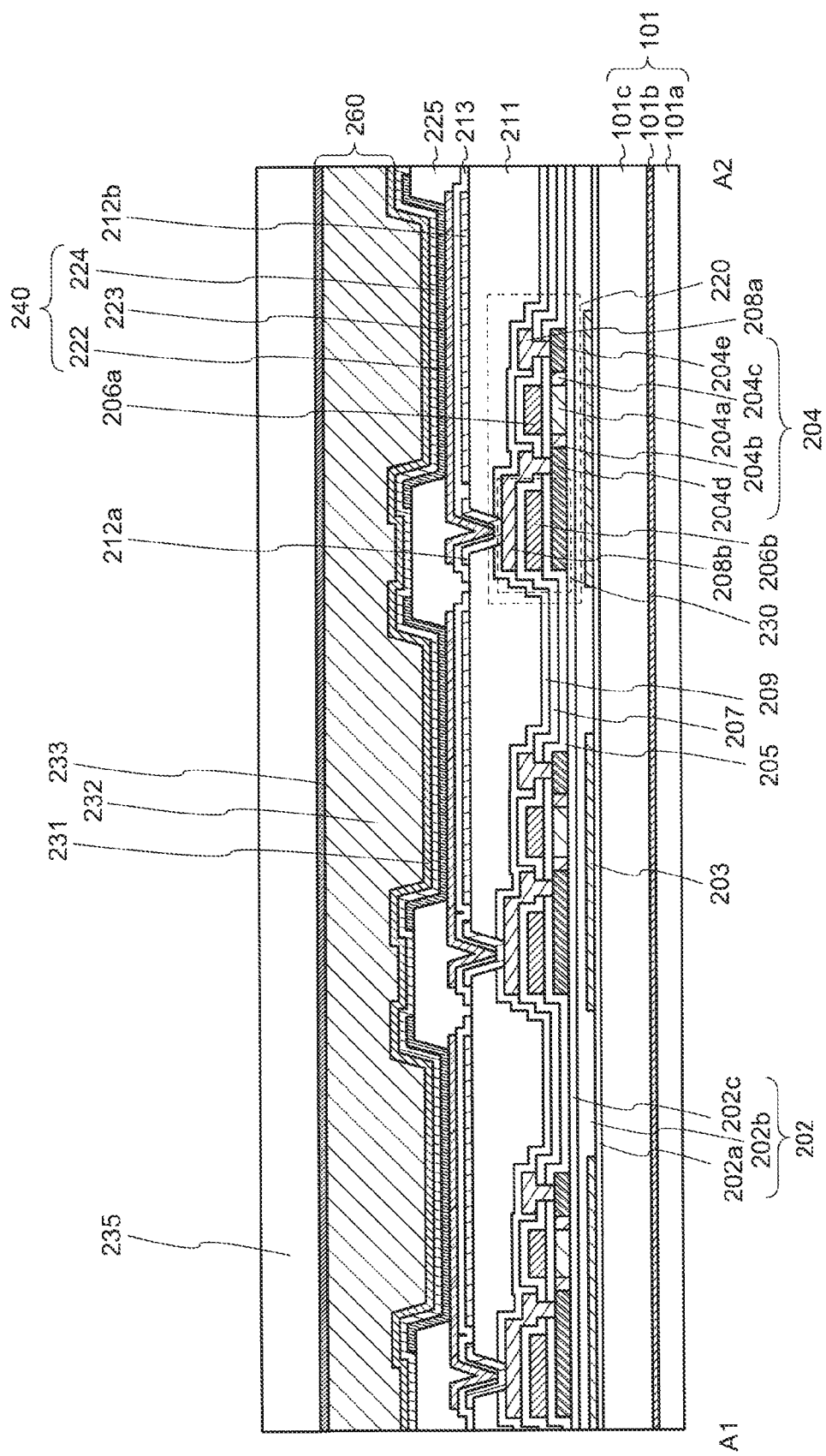
FIG. 6B is a cross-sectional view for explaining a manufacturing method of a display device related to one embodiment of the present invention.
Figure 6C:
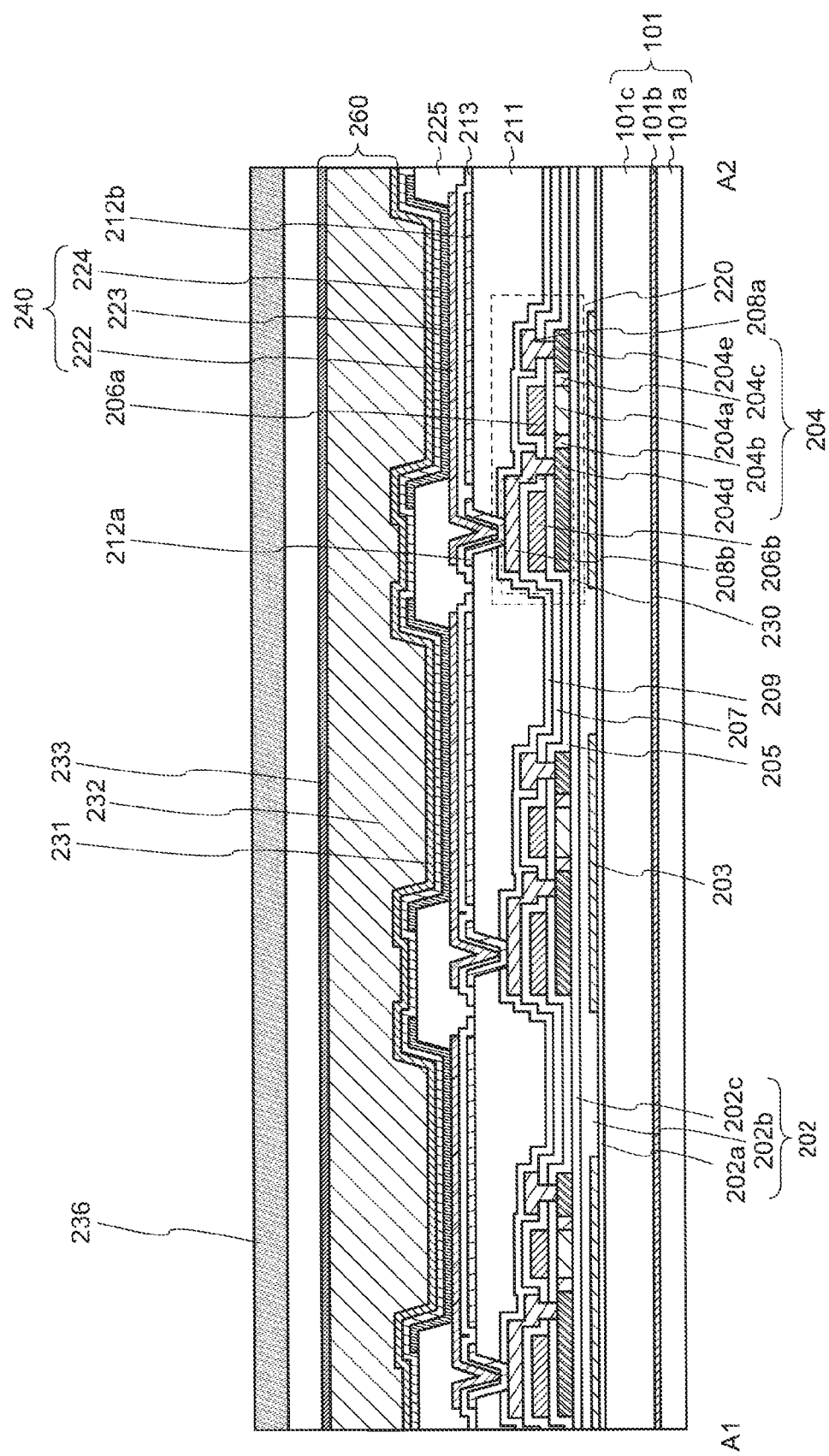
FIG. 6C is a cross-sectional view for explaining a manufacturing method of a display device related to one embodiment of the present invention.

Next, a method for manufacturing the display device 100 related to one embodiment of the present invention is explained while referring to FIG. 6A to FIG. 6C.

FIG. 6A is a cross-sectional view showing a method for manufacturing the display device 100 related to one embodiment of the present invention. A detailed description of a method for forming the substrate 101 to the counter electrode 224 included in the light emitting element 240 is omitted.

A sealing film 260 is formed above the counter electrode 224 of the light emitting element 240. First, the first inorganic insulating layer 231 is formed as the sealing film 260. The first inorganic insulating layer 231 is preferred to be formed by a film containing nitrogen in order to suppress moisture from entering the light emitting element 240, and for example, a silicon nitride film and an aluminum nitride film or the like is used as the film containing nitrogen. In the present embodiment, the case where a silicon nitride film is used as the first inorganic insulating layer 231 is explained.

Next, an organic insulating layer 232 is formed above the first inorganic insulating layer 231. For example, an acrylic resin, an epoxy resin, a polyimide resin, a silicone resin, a fluorine resin or a siloxane resin or the like can be used as the organic insulating layer 232. The film thickness of the organic insulating layer 232 is preferred to be 5 μm or more and 15 μm or less for example.

Next, a second inorganic insulating layer 233 is formed above the organic insulating layer 232. Similar to the first inorganic insulating layer 231, the second inorganic insulating layer 233 is formed from a film containing nitrogen in order to suppress moisture from entering the light emitting element 240. For example, a silicon nitride film, a silicon nitride oxide film or an aluminum nitride film or the like is used as the film containing nitrogen. In the present embodiment, a case where a silicon nitride film is used as the second inorganic insulating layer 233 is explained.

FIG. 6B is a diagram for explaining a process for forming a resin mask 235 above the second inorganic insulating layer 233. For example, an acrylic resin, a rubber resin, a silicone resin or a urethane resin can be used as the resin mask 235.

FIG. 6C is a diagram for explaining a process for forming the organic prevention film 236 above the resin mask 235. For example, an organic resin such as an epoxy resin or an acrylic resin is used as the organic prevention film 236.

When the film containing nitrogen is in contact with an organic resin having strong acidity, the generation of ammonia as explained in FIG. 4A to FIG. 4E is promoted, and the generation of ammonia increases. Therefore, in the case when the pH of the resin mask 235 is more acidic than the pH of the organic prevention film 236, there is a possibility that the generation of ammonia from the film containing nitrogen is promoted. In addition, the H+ of the organic resin in contact with the film containing nitrogen increases in an environment where not only water but also an acid exists. In this way, as shown in FIG. 4A to FIG. 4E, the attack frequency on Si—N by H+ becomes active, the N—H bonds increase and thereby the generation of NH$_3$ increases. Therefore, it is possible to suppress the generation of ammonia by weakening the acidity of the resin mask 235 in contact with the film containing nitrogen. In this way, it is preferred that the pH of the resin mask 235 is less acidic than the pH of the organic prevention film 236.

It is possible to control the pH of the resin mask 235 and the organic prevention film 236 by, for example, the amount of an initiator for curing the resin.

For example, the amount of the initiator for the organic prevention film 236 is less than the amount of the initiator for the resin mask 235. The amount of initiator in the organic prevention film 236 can be reduced by 20% to 50% compared with the amount of initiator of the resin mask 235. In this way, the pH of the organic prevention film 236 can be made more acidic than the pH of the resin mask 235.

In addition, the thickness of the organic prevention film 236 is preferred to be larger than the thickness of the resin mask 235. For example, the total thickness of the organic prevention film 236 and the resin mask 235 is preferred to be 10 μm or more and 20 μm or less. The thickness of the organic prevention film 236 is preferred to be 1 μm or more and 15 μm or less, and the thickness of the resin mask 235 is preferred to be 5 μm or more and 19 μm or less. In this way, it is possible to suppress the amount of ammonia generated by contact between the film containing nitrogen and the resin mask 235, and it is possible to neutralize the ammonia by the organic prevention film 236. In addition, in the case when the thickness of the resin mask 235 and the thickness of the organic prevention film 236 are less than 10 μm, there is a possibility that scratches cannot be prevented as a result of handling in a subsequent process. In addition, if the thickness exceeds 20 μm, there is a possibility that the organic insulating film 236 which is applied by inkjet may not be able to stop the flow due to a convex shaped insulating layer called a dam which is formed at the end part of the substrate 101. In addition, since there is a limit to the height at which the convex insulating layer can be formed, when the thickness of the organic prevention layer 236 exceeds 20 μm, it becomes difficult to form convex shaped insulating layer having a height which can prevent the organic prevention film 236 from flowing. In addition, since the amount of resin applied increases if the organic prevention film 236 is thick, there is a possibility that display defects (such as streaks) are produced due to poor curing. Furthermore, the resin overflows from the convex shaped insulting layer which may cause bending defects on the terminal side or there is a possibility that cutting defects are produced when dividing the substrate 101 in order to separate the display device.

Next, although not shown in the diagram, the first inorganic insulating layer 231 and the second inorganic insulating layer 233 are etched using the organic prevention film 236 and the resin mask 235 as a mask. In this way, in the periphery region 110 of the substrate 101, it is possible to remove the first inorganic insulating layer 231 and the second inorganic insulating layer 233 and expose the terminal 107.

Finally, it is possible to manufacture the display device 100 shown in FIG. 1 and FIG. 3 by attaching the polarizing plate 102 above the organic prevention film 236.

As explained above, the pH of the resin mask 235 which is arranged above the second inorganic insulating layer 233 is made more acidic than the pH of the organic prevention film 236. In this way, the reaction between the second inorganic insulating layer 233 and the resin mask 235 which is formed later can be suppressed, the generation of ammonia can be reduced, and the generated ammonia can be neutralized by the organic prevention film 236. In this way, since it is possible to suppress the generated ammonia from reaching the polarizing plate 102, it is possible to suppress the polarizing plate 102 from being turning white.

<Structure of Periphery Region>

Figure 7:
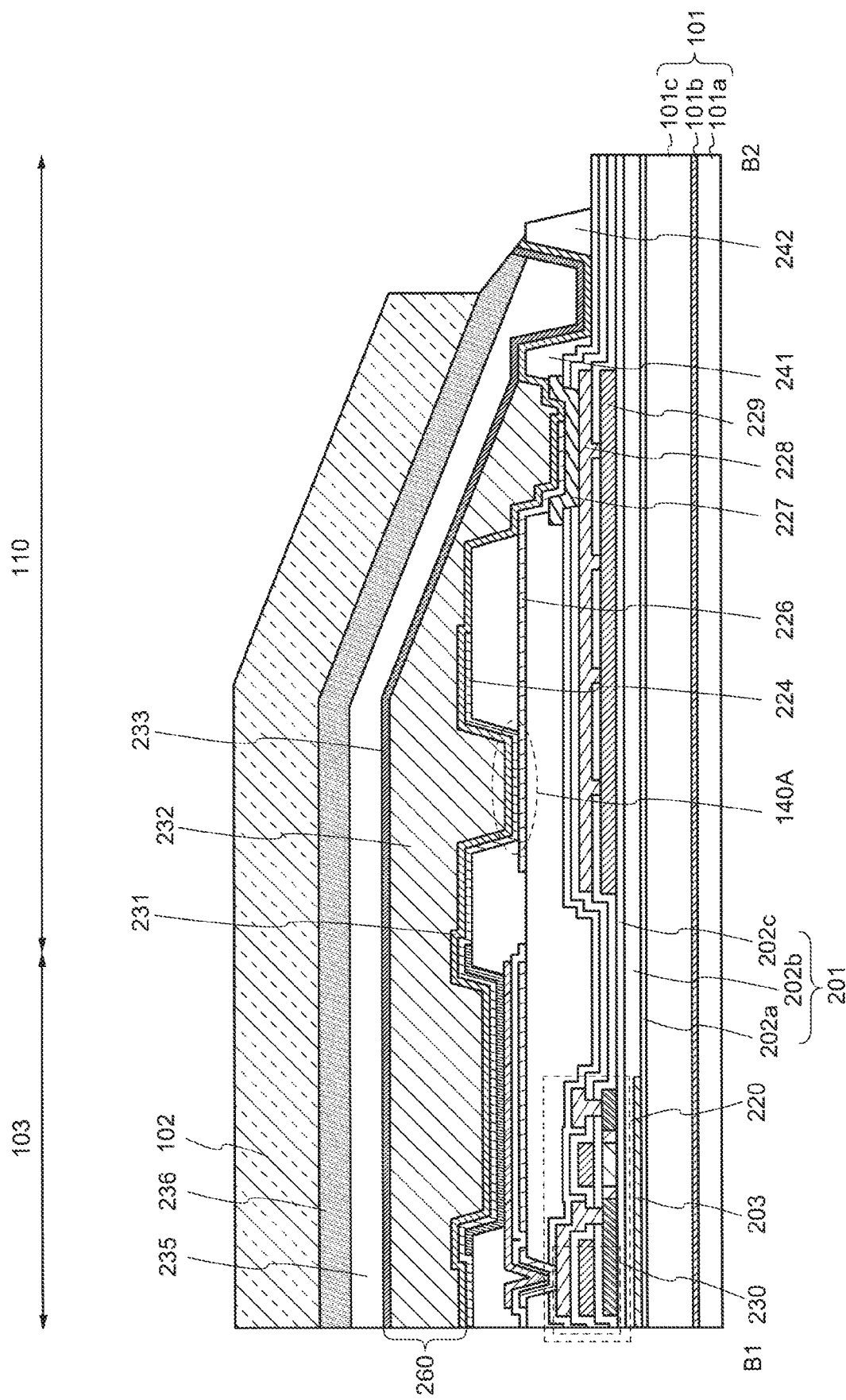
FIG. 7 is cross-sectional view along a line B1-B2 of a display region shown in FIG. 1.
Figure 8:
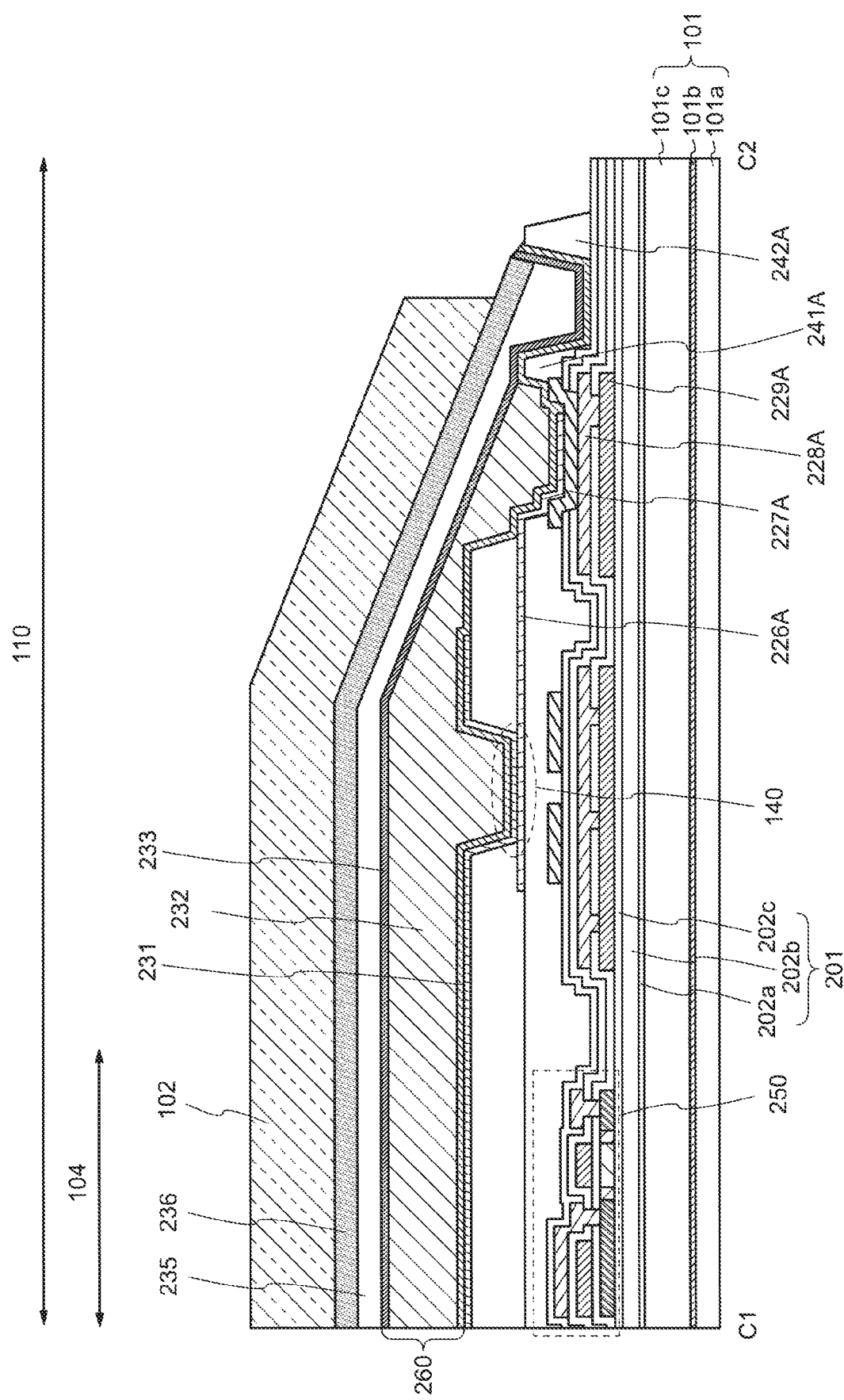
FIG. 8 is cross-sectional view along a line C1-C2 of a display region shown in FIG. 1.
Figure 9:
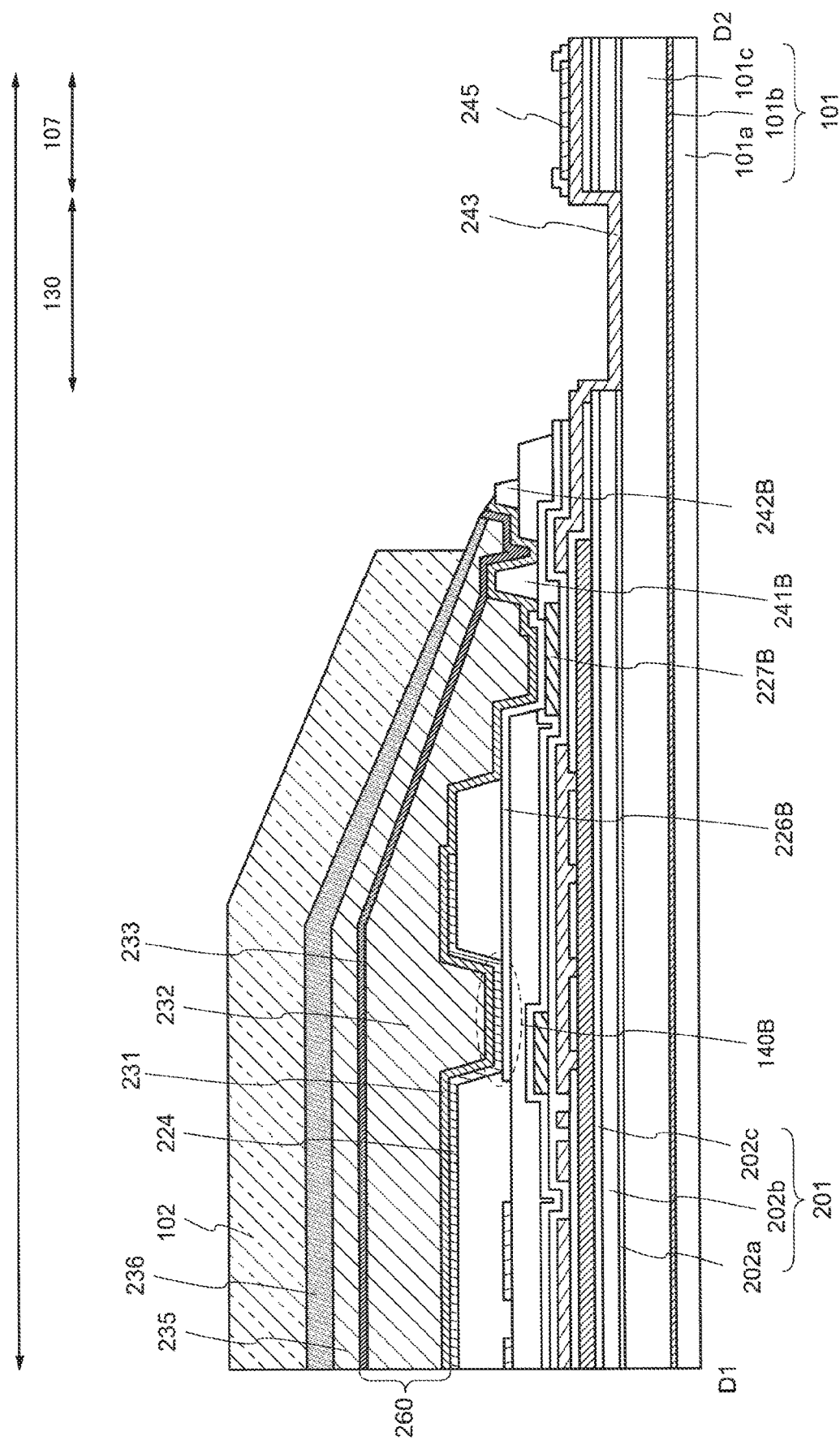
FIG. 9 is cross-sectional view along a line D1-D2 of a display region shown in FIG. 1.

Next, a structure of a cross section in the periphery region 110 of the display device 100 explained while referring to FIG. 7 to FIG. 9.

FIG. 7 is a cross-sectional view of the display device 100 shown in FIG. 1 along a line B1-B2. The upper part of the periphery region 110 of the substrate 101 shown in FIG. 7 is a region where various wirings are routed. As shown in FIG. 7, in the periphery region 110, the counter electrode 224 of the light emitting element 240 is arranged with a cathode contact 140 connected to the transparent conductive film 226. The transparent conductive film 226 is electrically connected to a conductive layer 227, a conductive layer 228 and a wiring layer 229. That is, the counter electrode 224 is electrically connected to any of the plurality of terminals 107 by the wiring layer 229.

Convex shaped insulating layers 241 and 242 called dams are arranged at the end of the substrate 101. The organic insulating layer 232 is stopped by the insulating layer 241. In addition, the first inorganic insulating layer 231, the second inorganic insulating layer 233, the resin mask 235, and insulating layer 242 are also arranged. In addition, the first inorganic insulating layer 231 and the second inorganic insulating layer 233 have a region which overlaps from the insulating layer 241 to the insulating layer 242. By sealing the organic insulating layer 232 using the first inorganic insulating layer 231 and the second inorganic insulating layer 233, it is possible to prevent moisture entering from the exterior from reaching the light emitting element 240 through the organic insulating layer 232.

The first inorganic insulating layer 231 and the second inorganic insulating layer 233 are arranged above the convex shaped insulating layer 242. The first inorganic insulating layer 231 and the second inorganic insulating layer 233 are removed by etching using the organic prevention film 236 as a mask. Therefore, the side surface of the organic prevention film 236 overlaps the side surface of the convex shaped insulating layer 242 via the first inorganic insulating layer 231 and the second inorganic insulating layer 233.

FIG. 8 is a cross-sectional view of the display device 100 shown in FIG. 1 along the line C1-C2. A periphery region 110 of the substrate 101 shown in FIG. 8 is a region where a scanning line drive circuit 104 is arranged. As shown in FIG. 8, the scanning line drive circuit 104 is arranged with a transistor 250. The transistor 250 may have the same structure or a different structure from the transistors 210 and 220 which are in the pixel 109. The light shielding layer 203 is not necessarily arranged in the scanning line driver circuit 104.

In addition, the counter electrode 224 is arranged with a cathode contact 140A connected to the transparent conductive film 226A in a region between the scanning line drive circuit 104 and the end part of the substrate 101. The transparent conductive film 226A is electrically connected to the conductive layer 227A, the conductive layer 228A and the wiring layer 229A. That is, the counter electrode 224 is electrically connected to any of the plurality of terminals 107 by the wiring layer 229A.

The first inorganic insulating layer 231 and the second inorganic insulating layer 233 are arranged above the convex shaped insulating layer 242A. The first inorganic insulating layer 231 and the second inorganic insulating layer 233 are removed by etching using the organic prevention film 236 as a mask.

Therefore, the side surface of the organic prevention film 236 overlaps a side surface of the convex shaped insulating layer 242A interposed by the first inorganic insulating layer 231 and the second inorganic insulating layer 233.

FIG. 9 is a cross-sectional view of the display device 100 shown in FIG. 1 along the line D1-D2. A periphery region 110 of the substrate 101 shown in FIG. 9 includes a bent region 130 and a plurality of terminals 107.

The counter electrode 224 of the light emitting element 240 is arranged with a cathode contact 140B which is connected to the transparent conductive film 226. The wiring layer 243 is a lead wiring. The wiring layer 243 extends in the periphery region 110 and is exposed in the vicinity of the end part of the periphery region 110. A region which contacts the wiring layer 243 and the transparent conductive film 245 becomes the terminal 107.

Since the inorganic insulating layer has particularly poor toughness, and thus easily cracks as the substrate 101 bends, cracks easily occur and the inorganic insulating layer is removed in the bent region 130. In order to secure the strength of this region, a resin layer or the like may be further arranged above the wiring layer 244 so as to cover the bent region 130.

The first inorganic insulating layer 231 and the second inorganic insulating layer 233 are arranged above the convex shaped insulating layer 242B.

The first inorganic insulating layer 231 and the second inorganic insulating layer 233 are removed by etching using the organic prevention film 236 as a mask. In this way, the first inorganic insulating layer 231 and the second inorganic insulating layer 233 in the bent region 130 and the terminal 107 are removed. Therefore, the side surface of the organic prevention film 236 overlaps the side surface of the convex shaped insulating layer 242A interposed by the first inorganic insulating layer 231 and the second inorganic insulating layer 233.

As explained while referring to FIG. 7 to FIG. 9, the organic prevention film 236 is stopped by the convex shaped insulating layers 242, 242A and 242B which function as dams. That is, the display region 103 and the scanning line drive circuit 104 are covered by the organic prevention film 236. In addition, the resin mask 235 is not exposed since it is covered by the organic prevention film 236. In this way, it is preferred to cover the display region 103 and the scanning line drive circuit 104 with the organic prevention film 236 which suppresses ammonia ions from moving and reaching the polarizing plate 102. On the other hand, the organic prevention film 236 does not have to completely cover the resin mask 235 and may be provided at least in a region which overlaps the display region 103.

Second Embodiment

Another example of the structure of the display device 100 related to one embodiment of the present invention is explained while referring to FIG. 10 to FIG. 13. In the present embodiment, a display device 100A is explained in which a touch sensor 120 is provided above a sealing film 260.

Figure 10:
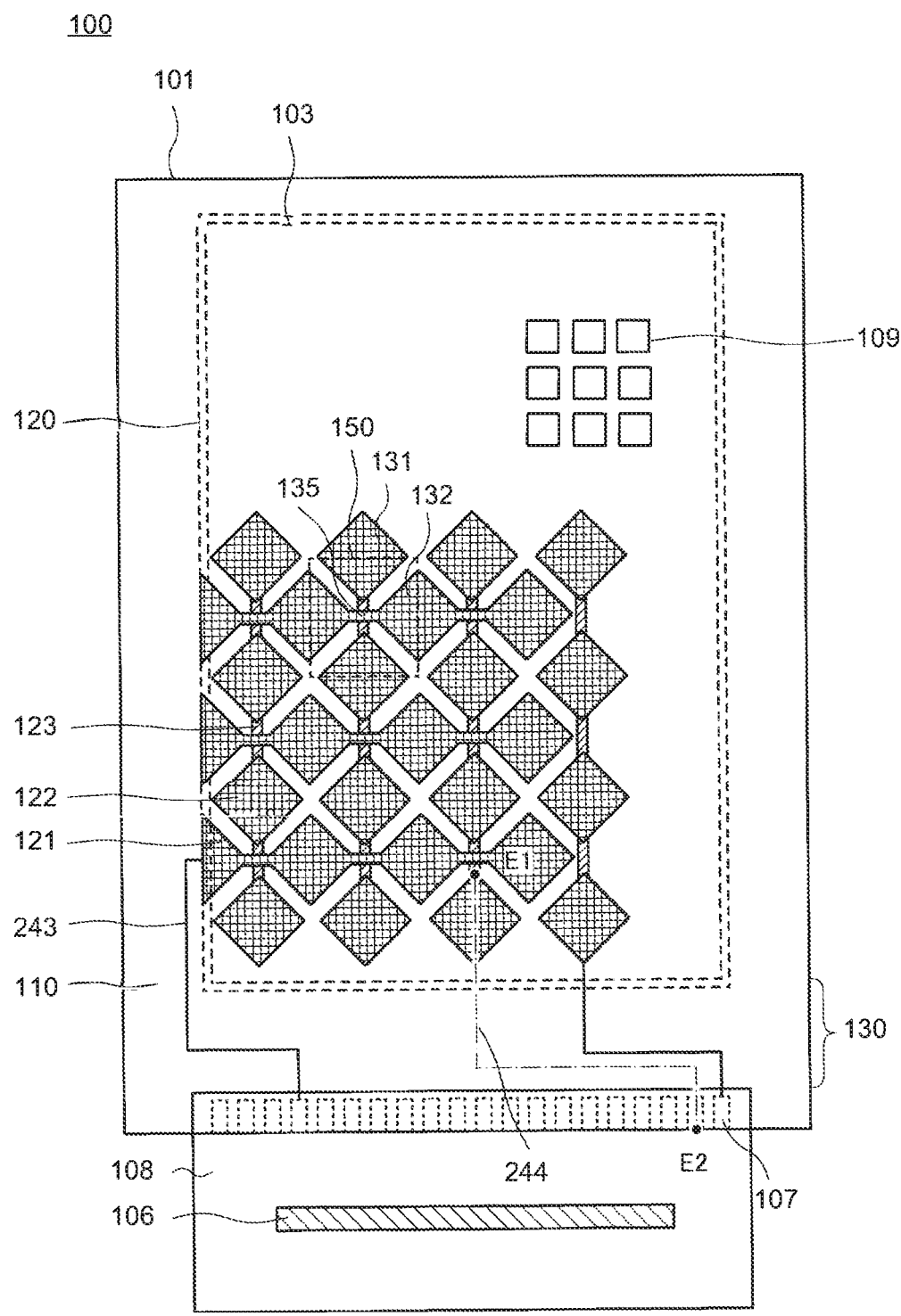
FIG. 10 is a schematic view showing a structure of a display device related to one embodiment of the present invention.

FIG. 10 is a planar diagram of a display device 100A related to one embodiment of the present invention. Apart from a touch sensor 120 being provided so as to overlap the display region 103 which is provided over the substrate 101, and the scanning line drive circuit 104 and the polarizing plate 102 not being shown in the diagram, the structure of the display device 100A shown in FIG. 10 is the same as that of the display device 100 shown in FIG. 1.

The touch sensor 120 includes a plurality of sensor electrodes 121 arranged in a stripe shape in a row direction and a plurality of sensor electrodes 122 arranged in a stripe shape in a column direction. One of the sensor electrode 121 and the sensor electrode 122 is also called a transmission electrode (Tx), and the other is also called a reception electrode (Rx). Each sensor electrode 121 and each sensor electrode 122 are separated from each other, and a capacitance is formed between them. For example, the capacitance changes when a human finger or the like touches the display region 103 via the sensor electrode 121 and the sensor electrode 122 (referred to as a touch herein), and the position of the touch is determined by reading this change. In this way, the sensor electrode 121 and the sensor electrode 122 form a so-called projection capacitive touch sensor 120.

The sensor electrode 122 is electrically connected to a wiring layer 243 which is arranged in the periphery region 110 of the display region 103. The terminal 107 is connected to the flexible printed circuit substrate 108, and a touch sensor signal is applied from the driver IC 106 to the sensor electrode 122 via the terminal 107. Furthermore, the wiring layer 243 may also be provided in a region which overlaps the scanning line driver circuit 104.

Similarly, the sensor electrode 121 is electrically connected to the wiring layer 244 which is arranged in the periphery region 110 of the display region 103. The terminal 107 is connected to the flexible printed circuit substrate 108, and a touch sensor signal is applied from the driver IC 106 to the sensor electrode 122 via the terminal 107.

In the touch sensor 120, the sensor electrode 121 includes a plurality of conductive layers 131 which have a substantially square shape, and a connection electrode 123, and the sensor electrode 122 includes a plurality of conductive layers which have a substantially square shape, and a connection region 135. In addition, the sensor electrode 121 and the sensor electrode 122 are electrically independent and separated from each other.

Figure 11:
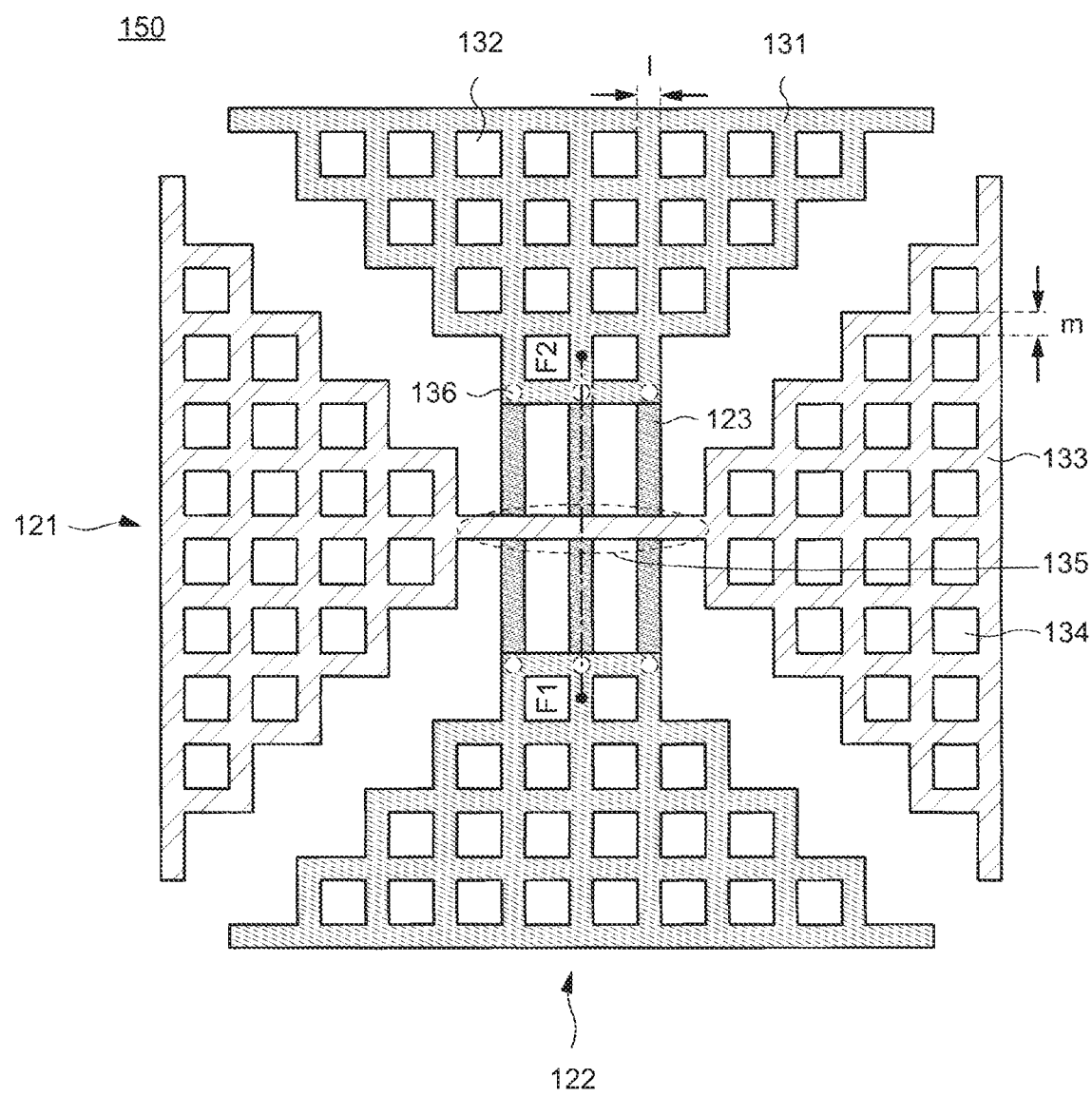
FIG. 11 is an expanded diagram of a part of a display device shown in FIG. 10.

FIG. 11 is an expanded diagram of a region 150 in the display device 100A shown in FIG. 10. Although different hatchings are shown in FIG. 11 in order to distinguish the sensor electrode 121 and the sensor electrode 122, the sensor electrode 121 and the sensor electrode 122 are formed from the same conductive layer. In the sensor electrode 121, conductive layers 133 which are adjacent left and right are connected via a connection region 135. In the sensor electrode 122, conductive layers 131 which are adjacent up and down are connected via the connection electrode 123. The sensor electrode 121 includes a plurality of conductive layers 133 and a plurality of openings 134, and the sensor electrode 122 includes a plurality of conductive layers 131 and a plurality of openings 132. In each of the conductive layers 131 and the conductive layers 133, the plurality of openings 132 and the plurality of openings 134 are arranged in a matrix. In this way, the conductive layer 131 and the conductive layer 133 have a mesh shape. Here, a width I of wiring which forms the conductive layer 131 is 1 μm or more and 10 μm or less, or 2 μm or more and 8 μm or less and typically 5 μm. Similarly, a width m of wiring which forms the conductive layer 133 is 1 μm or more and 10 μm or less, or 2 μm or more and 8 μm or less and typically 5 μm.

As shown in FIG. 11, the connection region 135 which connects left and right conductive layers 133 is arranged along a first direction, and the connection electrode 123 which connects up and down conductive layers 131 is arranged in a second direction which intersects the first direction. In other words, the connection electrode 123 has a region which intersects a part of the sensor electrode 121. Furthermore, although the width of the connection electrode 123 is shown as the same width as the width I of the conductive layer 131 in FIG. 11, it may also be larger than the width I of the conductive layer 131. The connection electrode 123 is preferred not to overlap the light emitting region of the light emitting element 240 of the pixel 109.

Figure 12:
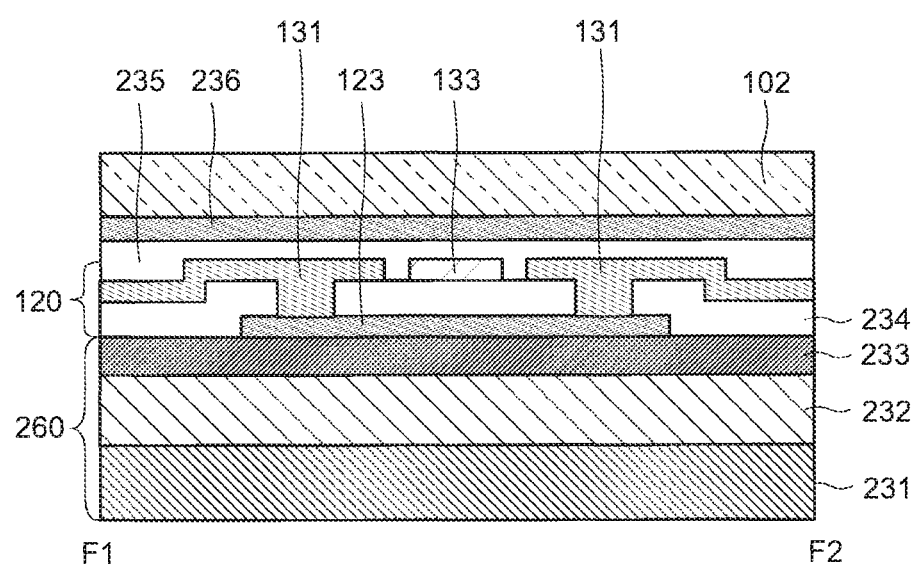
FIG. 12 is cross-sectional view along a line F1-F2 of a display device shown in FIG. 11.

FIG. 12 is a cross-sectional view along the line F1-F2 of the touch sensor 120 shown in FIG. 11. Furthermore, an illustration of the structure below the first inorganic insulating layer 231 is omitted in FIG. 12. As shown in FIG. 12, a third inorganic insulating layer 234 is arranged under the sensor electrode 121 and the sensor electrode 122 in order to prevent the sensor electrode 121 and the sensor electrode 122 from contacting each other. Next, the connection electrode 123 for connecting conductive layers 131 adjacent up and down above and below the sensor electrode 122 is arranged via the third inorganic insulating layer 234. In this way, it is possible to prevent the sensor electrode 121 and the sensor electrode 122 from contacting each other in the region where the sensor electrode 121 and the sensor electrode 122 intersect.

For example, a silicon nitride film, a silicon nitride oxide film or an aluminum nitride film or the like is used for the third inorganic insulating layer 234 similar to the first inorganic insulating layer 231 and the second inorganic insulating layer 233. In addition, the third inorganic insulating layer 234 is in contact with the resin mask 235.

In the display device 100A related to one embodiment of the present invention, the organic prevention film 236 is arranged between the resin mask 235 and the polarizing plate 102. The organic prevention film 236 is arranged so as to cover at least the display region 103. In this way, it is possible to suppress the ammonia which is generated by contact between the third inorganic insulating layer 234 and the resin mask 235 from reaching the polarizing plate 102 by the organic prevention film 236.

The organic prevention film 236 has a function for neutralizing or adsorbing ammonia. For example, in the case when the organic prevention film 236 neutralizes ammonia, the pH of the organic prevention film 236 is preferred to exhibit a stronger acidity than the pH of the resin mask 235.

The thickness of the organic prevention film 236 is preferred to be larger than the thickness of the resin mask 235. For example, the total thickness of the organic prevention film 236 and the resin mask 235 is preferred to be 10 μm or more and 20 µm or less. The thickness of the organic prevention film 236 is preferred to be 1 µm or more and 15 µm or less, and the thickness of the resin mask 235 is preferred to be 5 µm or more and 19 µm or less.

The organic prevention film 236 may have a function for adsorbing ammonia. For example, an organic resin containing transparent fine particles such as silicon oxide, alumina, calcium oxide and aluminum silicate is used as the organic prevention film 236. By including porous fine particles in the organic resin, it is possible to adsorb ammonium ions without affecting the light extraction efficiency. The particle size of the transparent fine particles is preferred to be, for example, 1 µm or more and 100 µm or less. In addition, it is possible to n suppress the occurrence of light scattering by adding transparent fine particles at 10% or more and 30% or less per unit volume.

According to the display device 100A related to one embodiment of the present invention, it is possible to suppress the amount of ammonia which is generated by contact between the third inorganic insulating layer 234 and the resin mask 235. In addition, it is possible to adsorb ammonia which is generated by contact between the third inorganic insulating layer 234 and the resin mask 235 using the organic prevention film 236. In this way, since it is possible to suppress ammonia reaching the polarizing plate 102, it is possible to suppress the polarizing plate 102 turning white. Therefore, the reliability of the display device 100A can be improved.

Figure 13:
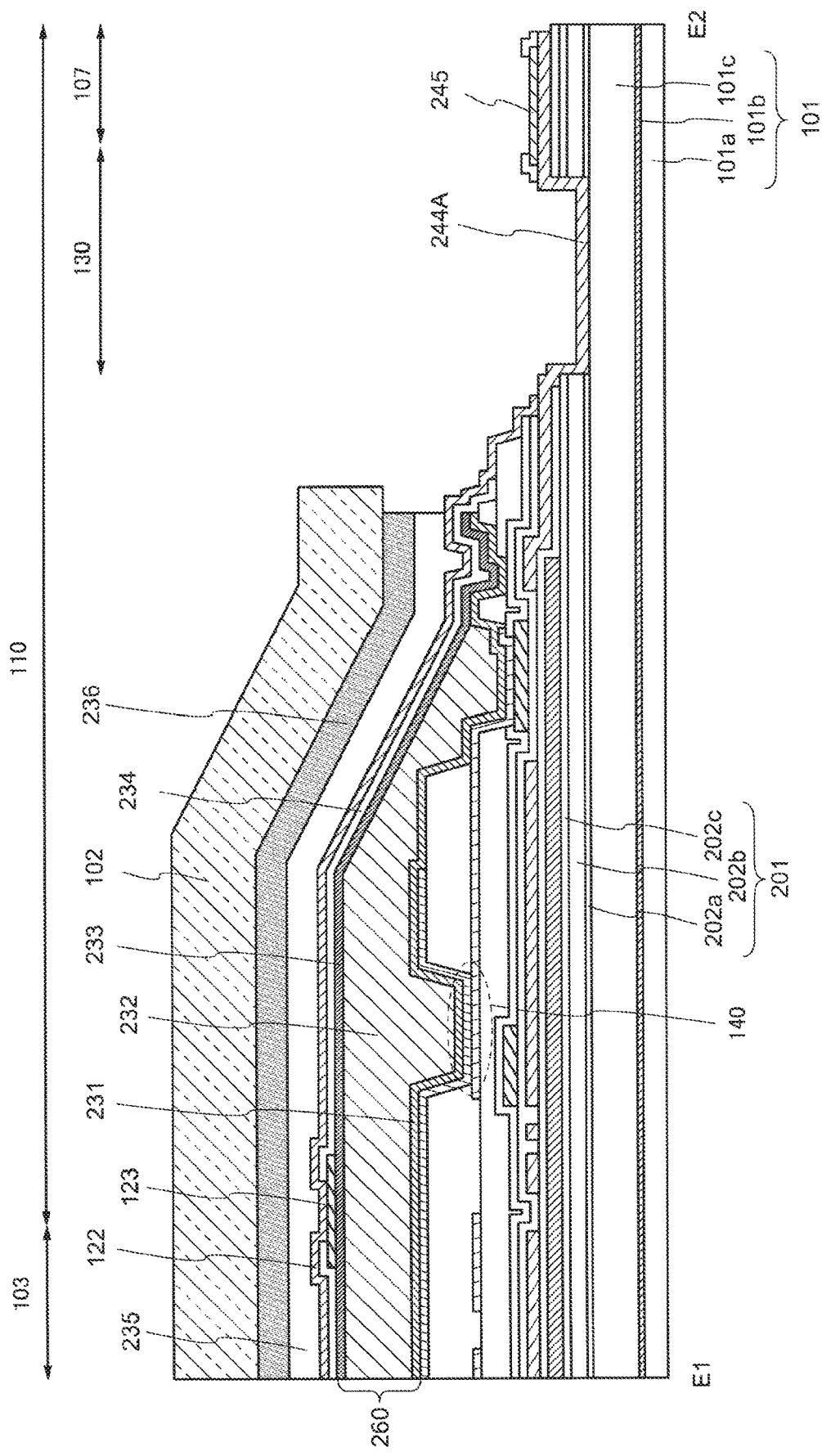
FIG. 13 is cross-sectional view along a line E1-E2 of a display region shown in FIG. 10.

FIG. 13 is a cross-sectional view along line E1-E2 of the display device 100A shown in FIG. 10. The structure from the substrate 101 to the sealing film 260 is the same as in FIG. 1. In the present embodiment, the touch sensor 120 is arranged above the second inorganic insulating layer 233 of the sealing film 260. FIG. 13 shows a connection region between the sensor electrode 122 and the connection electrode 123. The connection electrode 123 is arranged above the second inorganic insulating layer 233, the third inorganic insulating layer 234 is arranged above the connection electrode 123, and the sensor electrode 122 is arranged above the third inorganic insulating layer 234. The wiring layer 244A extends in the periphery region 110 and is exposed near the end part of the periphery region 110. A region in contact with the wiring layer 244A and the transparent conductive film 245 becomes the terminal 107.

Although the organic prevention film 236 is shown as covering the resin mask 235 in the periphery region 110 which surrounds the display region 103 shown in FIG. 13, one embodiment of the present invention is not limited to this. The organic prevention film 236 only needs to overlap at least the display region 103. When the organic prevention film 236 overlaps at least the display region 103, the generated ammonia can be neutralized or adsorbed by the organic prevention film 236. In this way it is possible to suppress the polarizing plate 102 becoming white due to ammonia reaching the polarizing plate 102.

In the display devices 100 and 100A related to one embodiment of the present invention, the organic prevention film 236 is arranged above the resin mask 235 which is in contact with a film including nitrogen, and thereby it is possible to suppress the ammonia generated by contact between the film including nitrogen and the resin mask 235 from reaching the polarizing plate 102. In this way, since it is possible to suppress a polarizing plate turning white due to ammonia, the reliability of the display devices 100 and 100A can be improved.

What is claimed is:
1. A display device comprising:
a first substrate;
a display region with pixels each including a light emitting element above the first substrate;
a first inorganic insulating layer covering the display region;
a first organic insulating layer on the first inorganic insulating layer;
a second inorganic insulating layer on the first organic insulating layer;
a second organic insulating layer on the second inorganic insulating layer;
a third organic insulating layer on the second organic insulating layer, acidity of the third organic insulating layer being stronger than acidity of the second organic insulating layer;
a polarizing plate arranged on the third organic insulating layer; and
a convex shaped insulating layer in a periphery region surrounding the display region,
wherein the first inorganic insulating layer and the second inorganic insulating layer are stacked above the convex shaped insulating layer,
a first side surface of the third organic insulating layer overlaps a second side surface of the convex shaped insulating layer, and
the first inorganic insulating layer and the second inorganic insulating layer is located between the first side surface and the second side surface.

2. The display device according to claim 1, wherein a thickness of the third organic insulating layer is larger than a thickness of the second organic insulating layer.

3. The display device according to claim 1, wherein the total thickness of the third organic insulating layer and the second organic insulating layer is 10 µm or more and 20 µm or less.

4. The display device according to claim 1, wherein the third organic insulating layer is an organic resin including particles of silicon oxide, alumina, calcium oxide or aluminum silicate.

5. A display device comprising:
a first substrate;
a display region with pixels each including a light emitting element above the first substrate;
a first inorganic insulating layer covering the display region;
a first organic insulating layer on the first inorganic insulating layer;
a second inorganic insulating layer on the first organic insulating layer;
a first electrode on the second inorganic insulating layer;
a third inorganic insulating layer on the first electrode;
a second electrode on the third inorganic insulating layer and electrically connected to the first electrode;
a second organic insulating layer on the second electrode;
a third organic insulating layer on the second organic insulating layer, acidity of the third organic insulating layer being stronger than acidity of the second organic insulating layer, and
a polarizing plate arranged on the third organic insulating layer.

6. The display device according to claim 5, wherein a thickness of the third organic insulating layer is larger than a thickness of the second organic insulating layer.

7. The display device according to claim 5, wherein the total thickness of the third organic insulating layer and the second organic insulating layer is 10 µm or more and 20 µm or less.

8. The display device according to claim 5, wherein the third organic insulating layer is an organic resin including particles of silicon oxide, alumina, calcium oxide or aluminum silicate.

* * * * *